(12) United States Patent
Kolpak et al.

(10) Patent No.: US 9,536,975 B2
(45) Date of Patent: Jan. 3, 2017

(54) FERROELECTRIC DEVICES INCLUDING A LAYER HAVING TWO OR MORE STABLE CONFIGURATIONS

(71) Applicant: Yale University, New Haven, CT (US)

(72) Inventors: Alexie M. Kolpak, Boston, MA (US); Fred J. Walker, New Haven, CT (US); James W. Reiner, Palo Alto, CA (US); Charles H. Ahn, New Haven, CT (US); Sohrab Ismail-Beigi, Cambridge, MA (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 14/745,457

(22) Filed: Jun. 21, 2015

(65) Prior Publication Data

US 2015/0311309 A1    Oct. 29, 2015

Related U.S. Application Data

(63) Continuation of application No. 13/498,989, filed as application No. PCT/US2010/002642 on Sep. 29, 2010, now abandoned.

(60) Provisional application No. 61/246,688, filed on Sep. 29, 2009.

(51) Int. Cl.
*H01L 29/51*    (2006.01)
*H01L 21/28*    (2006.01)
*H01L 27/115*   (2006.01)
*H01L 29/78*    (2006.01)
*H03K 3/36*     (2006.01)

(52) U.S. Cl.
CPC ....... *H01L 29/516* (2013.01); *H01L 21/28291* (2013.01); *H01L 27/11585* (2013.01); *H01L 29/78391* (2014.09); *H03K 3/36* (2013.01)

(58) Field of Classification Search
CPC ............. H01L 29/516; H01L 29/78391; H01L 27/11585; H01L 21/28291; H03K 3/36
See application file for complete search history.

(56) References Cited

U.S. PATENT DOCUMENTS 6,906,366 B2 *   6/2005   Hsu ................... H01L 21/02189
                                                                257/295

* cited by examiner

*Primary Examiner* — David Vu
(74) *Attorney, Agent, or Firm* — Lumen Patent Firm

(57) ABSTRACT

Ferroelectric semiconductor devices are provided by including a ferroelectric layer in the device that is made of a material that is not ferroelectric in bulk. Such layers can be disposed at interfaces to promote ferroelectric switching in a semiconductor device. Switching of conduction in the semiconductor is effected by the polarization of a mechanically bi-stable material. This material is not ferroelectric in bulk but can be considered to be when the thickness is sufficiently reduced down to a few atomic layers. Devices including such ferroelectric layers are suitable for various applications, such as transistors and memory cells (both volatile and non-volatile).

12 Claims, 5 Drawing Sheets

FERROELECTRIC DEVICES INCLUDING A LAYER HAVING TWO OR MORE STABLE CONFIGURATIONS

CROSS REFERENCE TO RELATED APPLICATIONS

This application is a continuation of U.S. patent Ser. No. 13/498,989 filed Mar. 29, 2012.

U.S. application Ser. No. 13/498,989 is a 371 of international application PCT/US2010/002642, filed Sep. 29, 2010.

International application PCT/US2010/002642 claims the benefit of U.S. provisional application 61/246,688, filed Sep. 29, 2009.

GOVERNMENT SPONSORSHIP

This invention was made with Government support under contract number NSF 0520495 awarded by the National Science Foundation. The Government has certain rights in this invention.

FIELD OF THE INVENTION

This invention relates to ferroelectric devices.

BACKGROUND

When an electric field is applied to an object, the resulting charge separation in the object is referred to as electric polarization. Although most materials exhibit electric polarization only when an electric field is applied to the material, some materials exhibit electric polarization without an applied electric field (i.e., a spontaneous polarization). Such materials are often referred to as pyroelectric materials. For some pyroelectric materials, the direction of the spontaneous electric polarization can be switched using an applied electric field. Such materials are referred to as ferroelectric materials, and the switching of electric polarization in ferroelectric materials is analogous to the switching of magnetic moments in ferromagnetic materials. In particular, the polarization state of a ferroelectric is a non-volatile parameter that retains its value even if no power is supplied to a device including the ferroelectric.

Thus, applications of ferroelectrics to electronic device technology have been under investigation for some time. Representative examples of the state of the art include U.S. Pat. No. 6,093,242, U.S. Pat. No. 6,023,082, U.S. Pat. No. 6,080,235, and U.S. Pat. No. 6,602,720. However, it remains difficult to provide long-term stability of ferroelectric switching in connection with microelectronic devices.

SUMMARY

As described in greater detail below, we have found that interface effects, such as pinning of the electric polarization at an interface, can markedly affect whether or not a layer of material disposed on a substrate can actually have its polarization switched by an applied field. For example, the theoretically predicted ferroelectricity of epitaxial $SrTiO_3$ on Si (001) appears to be prevented by polarization pinning at the $Si/SrTiO_3$ interface. More importantly, from a practical perspective, we have also identified situations where interface effects promote ferroelectric switching rather than hinder it.

In particular, a layer of material that is not ferroelectric in bulk can exhibit ferroelectric switching when disposed at an interface. Such layers can advantageously be inserted into device structures to promote ferroelectric switching. For example, a layer of $ZrO_2$ (which is not ferroelectric in bulk) between a Si substrate with a (001) orientation and an $SrTiO_3$ layer provides a structure that is ferroelectrically switchable (i.e., both the $ZrO_2$ and $SrTiO_3$ layers have two stable polarization states, and switching between these states can be accomplished with an electric field).

FIG. 1a shows a simple example of such a structure. Here, a ferroelectric layer 104 is disposed on a semiconductor substrate 102. FIG. 1b shows an example similar to the example of FIG. 1a, except that an insulator 106 is disposed on the side of layer 104 that is opposite to substrate 102 (i.e., layer 104 is sandwiched between substrate 102 and layer 106). Layer 104 has at least two stable configurations (schematically shown as 103b and 105b on FIG. 1a) having different electrical polarizations (103a and 105a on FIG. 1a) and can be switched between these stable configurations with an applied electric field. Thus, layer 104 is ferroelectric. However, the material(s) used for layer 104 is/are not ferroelectric in bulk. We have unexpectedly found that layers of materials which are not ferroelectric in bulk can be ferroelectric in sufficiently thin layers, and that such ferroelectric layers can be advantageous for reducing/eliminating undesirable effects, such as interface pinning of electric polarization.

One class of materials that has been found to be suitable for layer 104 has composition $MX_2$, where M can be any of Zr, Hf, Ce, Ca, Pt, Pd, Rh, Ir, Ti, Fe, Ni, Co and V, and X can be any of O, F, S, As and P. Suitable materials also include transition metal oxides, chalcogenides, fluorides, or pnictides with a layered bulk crystal structure. Zirconium oxide ($ZrO_2$), hafnium oxide ($HfO_2$), calcium fluoride ($CaF_2$), cerium oxide ($CeO_2$) and mixtures thereof are some preferred compositions for layer 104. Layer 104 is a thin layer (thickness<20 nm) and is preferably a monolayer (i.e., a single layer of lattice unit cells).

Practice of the invention does not depend critically on the material of substrate 102, so any semiconductor can be employed for the substrate, including but not limited to Si and Ge. Practice of the invention also does not depend critically on the composition of layer 106 (if present). Layer 106 can be either ferroelectric or non-ferroelectric. If layer 106 is ferroelectric, the material of layer 106 can be either ferroelectric or non-ferroelectric in bulk. Preferably, layer 106 is ferroelectric. An important advantage of the present approach is that layer 106 can be a layer that would not be ferroelectric if disposed directly on substrate 102, but is ferroelectric when disposed on layer 104. For example, the $SrTiO_3$ in a $SrTiO_3/ZrO_2/Si$ structure can be ferroelectric, while the $SrTiO_3$ in a $SrTiO_3/Si$ structure would not be ferroelectric. Suitable materials for layer 106 include, but are not limited to: lead titanate, barium titanate, strontium titanate, and alloys or mixtures of these. Layer 106 can be either amorphous or crystalline, and preferably has a thickness sufficient to provide a barrier to the flow of electric current when a voltage is applied between a top electrode 206 (e.g., as shown on FIG. 2) and substrate 102. Preferably, layer 106 is substantially matched in size and symmetry to substrate 102 when this layer is crystalline.

Practice of the invention does not depend critically on the geometrical location of the ferroelectric layer 104 in a stack of multiple layers. For example, FIG. 1c shows a multi-layer stack 110 disposed on substrate 102. The stack of this example includes four layers 112, 114, 116, and 118. Any of these layers can have the properties of layer 104 as described above (i.e., not ferroelectric in bulk, ferroelectric in a thin layer as disposed in the stack). More generally, one or more layers such as layer 104 above can be included in a multi-layer stack having any number of layers.

FIG. 2 shows an application of the present approach. In this example, a transistor having source and drain terminals 202 and 204 is controlled by a gate electrode 206. An insulating stack 110 including a ferroelectric layer is disposed under gate electrode 206. Such a device can provide a non-volatile memory cell, based on the effect of the switchable electric polarization in stack 110 on current flow between source and drain. Other applications of such ferroelectric layers include transistors and volatile memory cells.

DETAILED DESCRIPTION

Figure 1A:
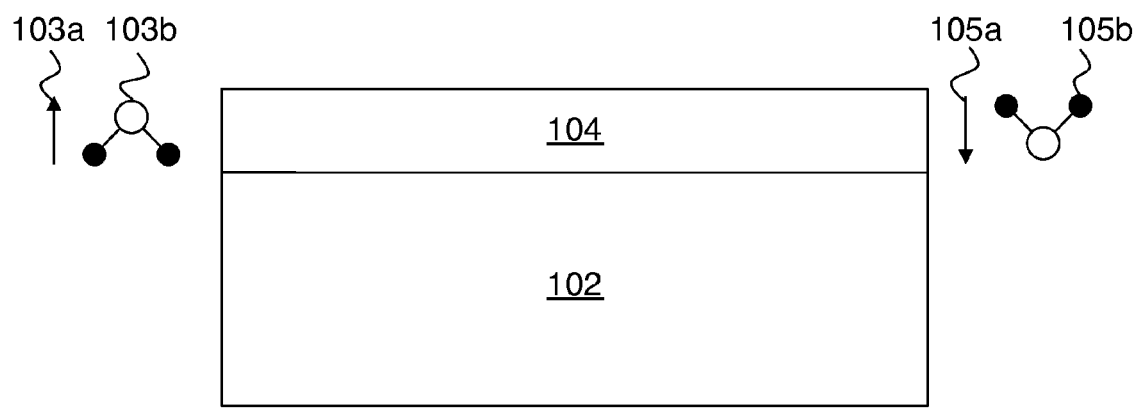
FIG. 1a shows a first embodiment of the invention.
Figure 1B:
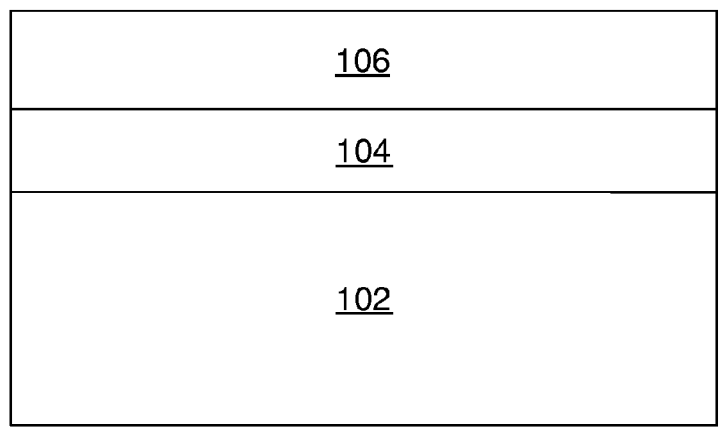
FIG. 1b shows a second embodiment of the invention.
Figure 1C:
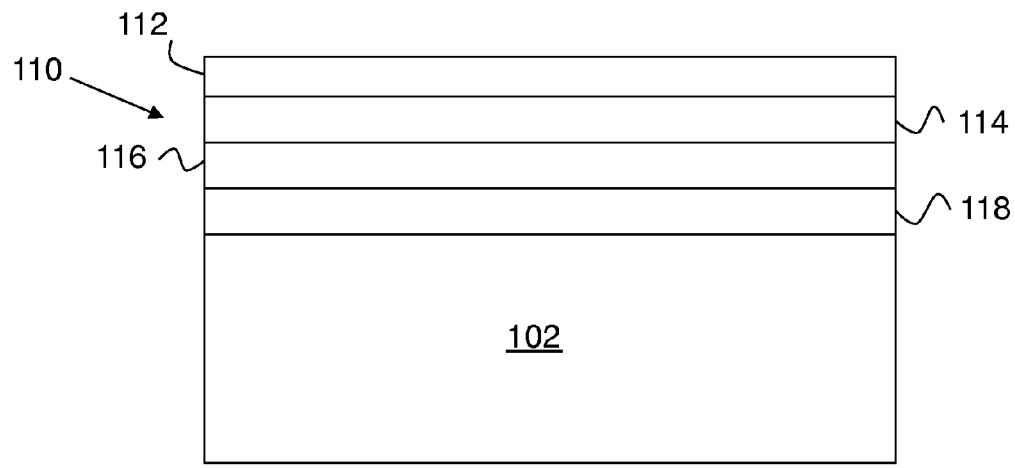
FIG. 1c shows a third embodiment of the invention.
Figure 2:
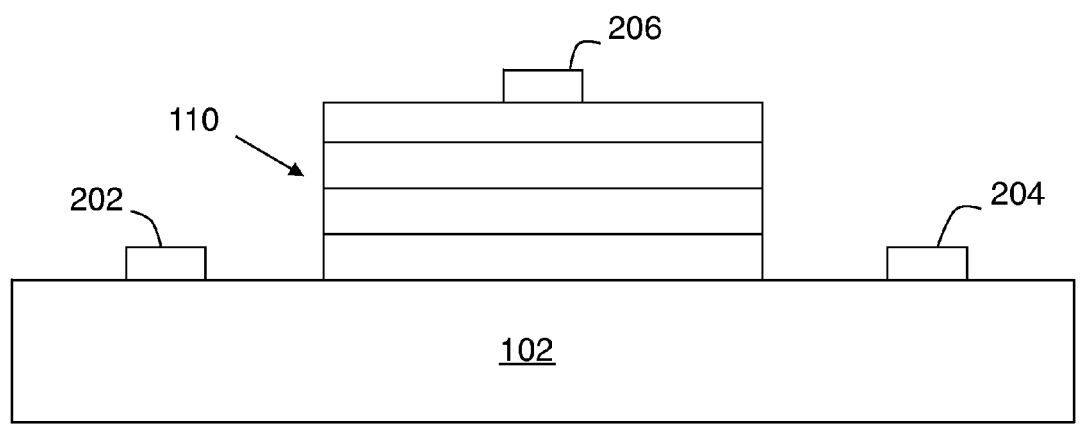
FIG. 2 shows a transistor including a ferroelectric layer according to principles of the invention.

This section provides theoretical and experimental results relating to the above-described concepts. Two sub-sections follow. In the first sub-section, evidence of pinning in the $SrTiO_3$/Si system is considered. In the second sub-section, ferroelectric layer approaches are described.

A) Pinning of $SrTiO_3$ Polarization on Si

A1) Introduction

The development of methods to incorporate functional properties such as ferroelectricity and ferromagnetism into existing silicon devices is a quintessential goal of materials research. A promising route towards achieving this goal is the epitaxial growth of perovskite oxides on silicon. By incorporating a Sr-based atomic buffer layer at the oxide-semiconductor interface, high quality $SrTiO_3$ (001) thin films can be grown directly on silicon substrates. As this method has so far been unsuccessful for most other perovskites, the $SrTiO_3$ on silicon system has received a great deal of attention as the most promising candidate for ferroelectric field effect transistors, as well as other applications.

While bulk $SrTiO_3$ is not ferroelectric, epitaxial $SrTiO_3$ on silicon is predicted, in the limit of thick films, to have an out-of-plane polarization and a room-temperature paraelectric-ferroelectric phase transition due to ferroelectric-strain coupling. However, epitaxial $SrTiO_3$ films fully relax to the unstrained, non-ferroelectric state when thicker than ~10 unit cells, limiting the possibility for ferroelectric $SrTiO_3$ on silicon to the regime of very thin $SrTiO_3$ films. At this scale, it is known that depolarizing fields can significantly reduce or eliminate polarization, even for films on a metallic substrate.

Despite these considerations, experimental studies of ultra-thin $SrTiO_3$ films on silicon have found signatures of ferroelectricity: X-ray adsorption near-edge spectroscopy (XANES) studies show that 2 nm $SrTiO_3$ films on silicon are polar, and recent piezoelectric force microscopy (PFM) results show that 2-4 nm $SrTiO_3$ films on silicon exhibit a stable, reversible PFM contrast in response to an applied tip voltage. These observations suggest that interface and/or surface phenomena—both of which can significantly affect the behavior of ferroelectric thin films—play an important role in the $Si/SrTiO_3$ system. While a number of studies have focused on determining the atomic structure and electronic properties of the $Si/SrTiO_3$ interface, the relationship between the interface and the potential ferroelectric properties in this system has not been examined. Furthermore, the effects of interface structure and chemistry on the properties of complex oxide films on semiconductors in general are unknown.

A2) Interface Geometry

We begin by discussing the behavior of the model $Si/SrTiO_3$ system, first via our theoretical work, and then through our experimental results. To understand the effects of the $Si/SrTiO_3$ interface structure, we performed DFT (density functional theory) calculations to determine the minimum energy atomic structures for 56 different interface compositions with varying amounts of Sr, O, Ti, and Si in the interface region. For each interface composition, we searched for metastable states corresponding to positively poled, negatively poled, and paraelectric $SrTiO_3$ films. In addition, we used this data set to determine the thermodynamic phase diagram of the $Si/SrTiO_3$ interface. Under the constraint that neither $SiO_2$ nor $TiSi_2$ forms at the interface, we predicted the structure that should be observed experimentally.

The predicted interface structure is in excellent agreement with our experimental STEM (scanning transmission electron microscope) data. In fact, this interface is the only one of the 56 studied that exhibits all four structural characteristics identified in the STEM image: i) the symmetry is (1×1), ii) there are no Si dimers, iii) a full monolayer of Sr atoms resides immediately above the silicon, and iv) the Ti—O column in the oxide is aligned with the top-most layer of silicon atoms. Furthermore, it matches well with our synchrotron XRD measurements, and with the structure proposed based on previous high resolution STEM images. In the following, we use this predicted interface structure as the primary example, ensuring that the theoretical principles presented here can be directly applied to the experimentally studied system.

A3) Theoretical Results

The most striking result of our DFT calculations is that the $Si/SrTiO_3$ heterostructure has one and only one metastable state in each of the 56 interface compositions studied. In every case, this state is characterized by a net positive polarization in the $SrTiO_3$ film. (We use the convention that positive polarization is directed away from the silicon substrate.) Furthermore, we observe that the polarization in the first oxide layer at the interface, $P_{int}$, is greater than or comparable to $P_{bulk}$, the polarization in bulk strained $SrTiO_3$. Away from the interface, the polarization decreases, asymptoting to a finite positive value if the polarization charge is screened by a top metal electrode or decaying to zero if it is not. Both the positively poled ground state and the lack of a metastable negatively poled state arise directly from the fundamental chemical interactions that characterize the $Si/SrTiO_3$ interface.

Another key feature of the $Si/SrTiO_3$ interface is that while the average film polarization depends on many parameters of the structure, such as the presence or absence of a top electrode, $P_{int}$ is a fixed property determined only by the interface. The fixed nature of $P_{int}$ is demonstrated most dramatically by replacing the top electrode by a full monolayer of surface oxygen vacancies, a perturbation that induces a large, monodomain negative polarization in other thin film ferroelectric systems. In the Si/SrTiO$_3$ system, such a perturbation results in a small net negative polarization; however, the interface polarization remains unchanged. In other words, P$_{int}$ is an intrinsic structural property of the interface. This has profound consequences for the potential ferroelectric behavior of the system: By imposing a pinned structural boundary condition on the polarization, the Si/SrTiO$_3$ interface prevents ferroelectric switching between monodomain polarization states.

The largely general features described above suggest that the interface phenomena observed in the Si/SrTiO$_3$ system are not unique to this interface but will be observed at any non-polar semiconductor/complex oxide interface. Indeed, we find that substituting the SrTiO$_3$ in our calculations with PbTiO$_3$ or BaTiO$_3$ results in a similar interfacial electron rearrangement and a large interface polarization, providing evidence that our results also describe the behavior of other systems. This generality has important consequences for the design of ferroelectric field effect transistors and other devices, as we expect that the fundamental physical properties of these interfaces will hinder ferroelectric switching.

A4) Experimental Confirmation

Figure 3:
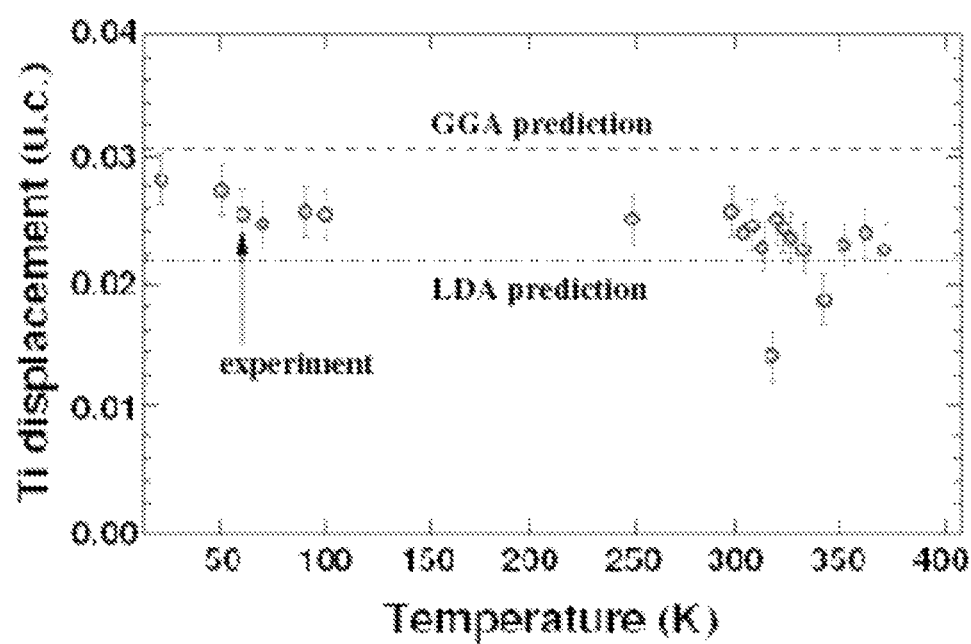
FIG. 3 shows experimental measurements of displacement in a $SrTiO_3$ film.

As a corollary to the lack of ferroelectric switching, we also expect that no paraelectric-ferroelectric phase transition will be observed in these systems. We now show that the experiments are indeed consistent with this theoretical model. We determine the displacement of the Ti from centrosymmetry as a fraction of the unit cell for a 5-unit-cell-thick SrTiO$_3$ film on silicon using temperature-dependent anomalous XRD measurements. Landau-Ginzberg-Devonshire theory predicts a transition temperature of Tc~280 K for the limit of thick films with perfect electrodes, and it is well known that both imperfect screening and decreasing film thickness suppress Tc. Therefore, one would expect to see evidence of a phase transition (i.e., a relatively sharp decrease of the Ti displacement to zero) below this temperature if Si/SrTiO$_3$ is ferroelectric at 0 K. However, as FIG. 3 shows, the experimental data demonstrate a temperature independent polarization, having a 2.5% displacement of the Ti in the SrTiO$_3$ unit cell, directed away from the Si substrate. In addition to confirming the theoretical prediction, both the direction and magnitude of the measured displacement are in good agreement with our DFT results, as indicated by the dashed lines in the figure. While the experimental data in FIG. 3 cannot rule out a phase transition above 380 K, the observation of a constant Ti displacement in the experimentally measured range, combined with our theoretical understanding of the interface properties, strongly suggests that no ferroelectric phase transition occurs in these epitaxial SrTiO$_3$ thin films on silicon.

B) Ferroelectric Layers

Thus far we have extracted the key features governing ferroelectric behavior in the epitaxial Si/SrTiO$_3$ system. While these features lead to the inhibition of ferroelectric switching, they also suggest means by which to overcome this inhibition. In particular, a switchable ferroelectric oxide on silicon should have a mechanically bistable interface structure with oppositely directed interface dipoles.

One route towards achieving these conditions is to use cation and/or anion substitutions to create a mechanically bistable interface. Compounds that form layered materials, composed of alternating planes of cations and anions along one crystallographic direction, turn out to be a useful starting point. For example, there are numerous transition metal chalcogenides, pnictides, fluorides, and even some oxides, with the formula MX$_2$ that crystallize in the CdI$_2$, pyrite, fluorite, or related layered structures. One can imagine removing a single monolayer of MX$_2$ from a bulk crystal. When MX$_2$ is a layered material, one expects the potential energy surface of the monolayer to be a double well: the cation can reside on either side of the plane of anions but must overcome a significant barrier to go from one side to the other, with the maximum energy corresponding to the fully planar configuration. (Depending on the bulk crystal structure, the potential energy surface may also include a third minimum between these two, corresponding to an X-M-X orientation.)

Performing DFT calculations, we find a number of bistable MX$_2$ interfaces; for example, Si/MX$_2$/SrTiO$_3$ films with M=Ti, Fe, Ni, and V and X=S, As, and P have bistable interface structures and two stable film polarization states. Monolayers of the oxides PtO$_2$ and ZrO$_2$, which in bulk crystallize in the CdI$_2$ and fluorite structures, respectively, also exhibit bistable behavior, as does a monolayer of fluorite itself (CaF$_2$). Perhaps the most promising interface structures are the latter two, as epitaxial thin films of each can be grown successfully on silicon, suggesting that growth of the proposed heterostructures will be experimentally feasible; in fact, thin (5-15 nm) layers of epitaxial CaF$_2$ have been used as a buffer layer in the growth of SrTiO$_3$ films on silicon.

Figure 4A:
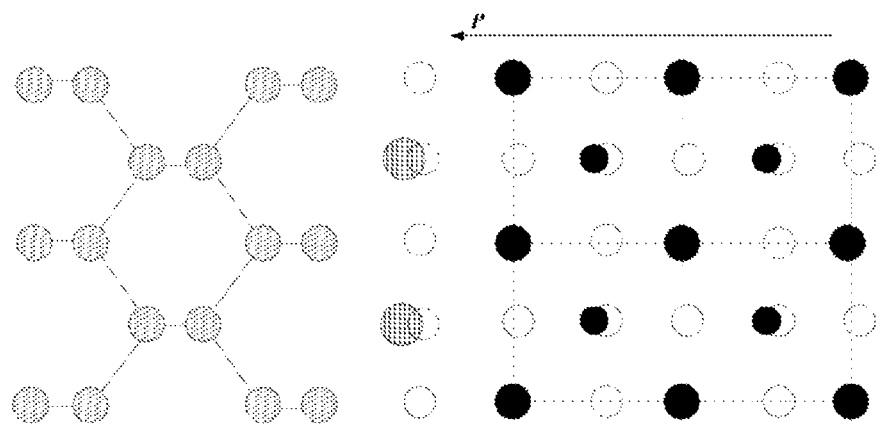
FIGS. 4a-b show two stable configurations for a $Si/ZrO_2/SrTiO_3$ structure.
Figure 4B:
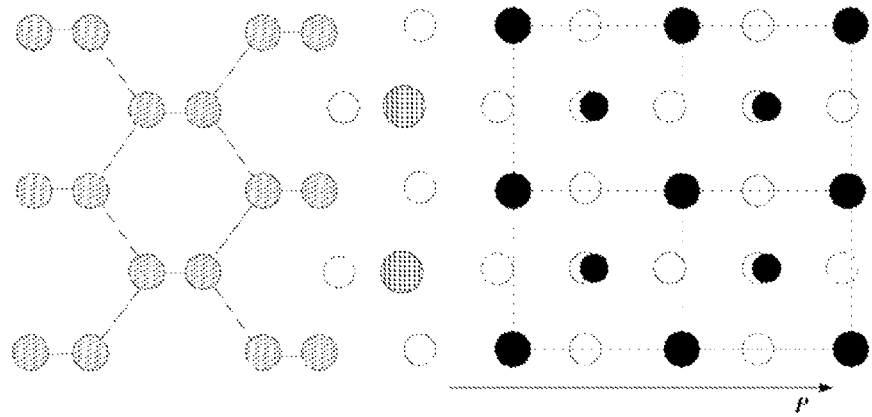
Figure 4B:
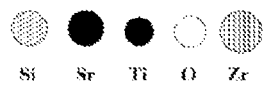
Figure 5:
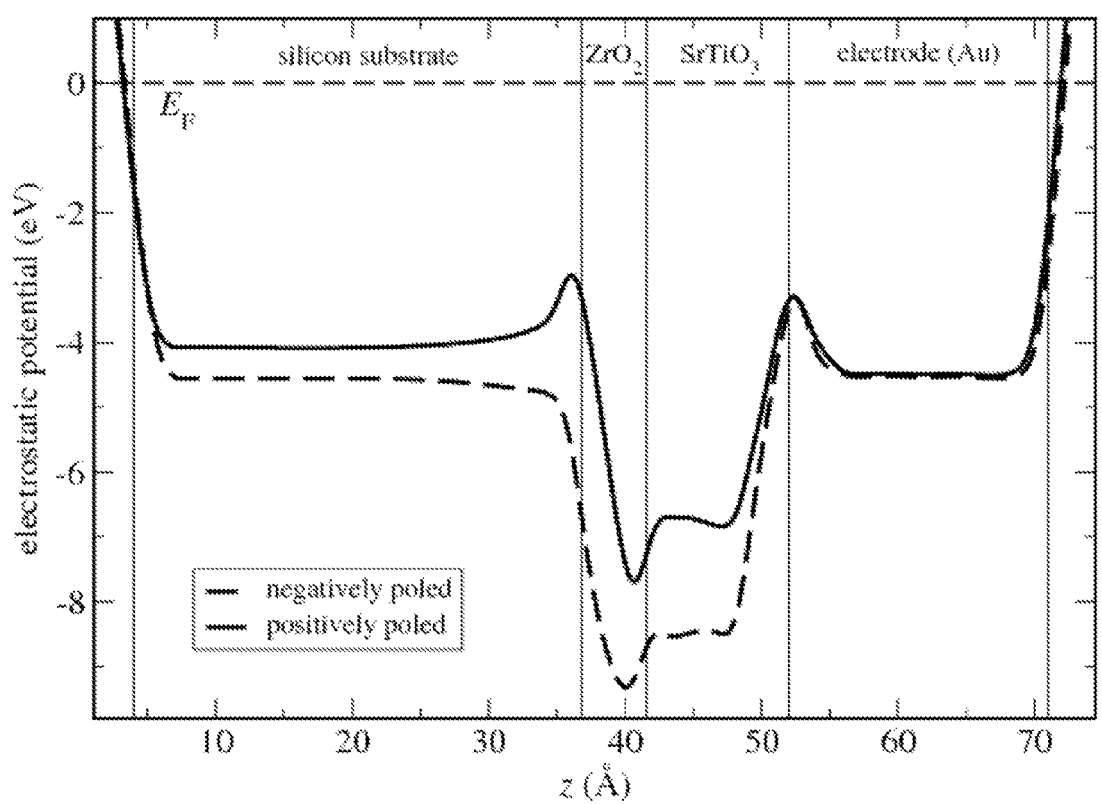
FIG. 5 shows plots of the electrostatic potential in a $Si/ZrO_2/SrTiO_3$ structure for the two stable polarization states.

As an example of this new class of interface structures, FIGS. 4a-b shows the atomic structure of the two stable Si/ZrO$_2$/SrTiO$_3$ interfaces. Continuous switching between the two minima in this system is possible, with computed barrier heights of 0.42 and 0.95 eV from the negatively and positively poled states, respectively. Similar values are found for the CaF$_2$-based heterostructure. In addition to stabilizing two polarization states in the oxide film, the presence of the bistable interface layer also couples the ferroelectric polarization to the electronic structure of the silicon substrate. As FIG. 5 illustrates, the electrostatic potential in the bulk silicon region differs by ~0.45 eV for the two polarization states in the Si/ZrO$_2$/SrTiO$_3$ system. This large change of silicon potential (close to half the Si band gap) at the interface directly translates into substantial changes of carrier density in the silicon substrate, satisfying a key requirement for designing a ferroelectric field effect device.

The class of bistable MX$_2$ interfaces is a novel type of ferroelectric, which, in contrast to traditional ferroelectrics, is only stable in very thin films. The complexity of these Si/MX$_2$/SrTiO$_3$ structures is required to avoid direct bonding between the Si and SrTiO$_3$, which our calculations show to never lead to bistable polarization behavior. If these structure are grown epitaxially on Si, the interfaces exhibit the key properties identified above as necessary for a ferroelectric on silicon device. Furthermore, the reversible interface polarization of the Si/MX$_2$/SrTiO$_3$ structures can affect charge carriers in the silicon, directly coupling the ferroelectric polarization to the silicon substrate. In addition to the examples mentioned above, we expect that atomic layers composed of other transition metal chalcogenides, pnictides, and fluorides that have layered bulk crystal structures will also exhibit similar properties, providing a large phase space within which to tailor the behavior of the system. Consideration of this class of interface structures thus opens a number of possibilities for engineering the properties of silicon/functional oxide systems.

The invention claimed is:

1. A method of ferroelectric switching, the method comprising:
   providing a semiconductor substrate;

providing a ferroelectric layer of a material disposed on or above said substrate;

wherein said ferroelectric layer has at least two stable configurations having different electrical polarizations;

switching said ferroelectric layer between said stable configurations with an applied electric field;

wherein said material does not exhibit bulk ferroelectricity; and wherein said ferroelectric layer is a single layer of lattice unit cells.

2. The method of claim 1, wherein said substrate comprises silicon or germanium.

3. The method of claim 1, wherein said material has a composition $MX_2$.

4. The method of claim 3, wherein said composition $MX_2$ has M selected from the group consisting of Zr, Hf, Ce, Ca, Pt, Pd, Rh, Ir, Ti, Fe, Ni, Co and V, and has X selected from the group consisting of O, F, S, As and P.

5. The method of claim 4, wherein said ferroelectric layer comprises a material selected from the group consisting of: zirconium oxide, hafnium oxide, calcium fluoride, cerium oxide and mixtures thereof.

6. The method of claim 1, wherein said ferroelectric layer is disposed on said substrate and wherein an insulator is disposed on a surface of said ferroelectric layer opposite said substrate.

7. The method of claim 6, wherein said insulator comprises a material selected from the group consisting of lead titanate, barium titanate, strontium titanate, and alloys or mixtures thereof.

8. The method of claim 7, wherein said insulator comprises strontium titanate.

9. The method of claim 6, wherein said insulator comprises a material that does not exhibit bulk ferroelectricity, but is ferroelectric when substantially matched in size and symmetry to said substrate.

10. The method of claim 6, wherein said insulator comprises a material that is not ferroelectric.

11. The method of claim 6, wherein said insulator is amorphous.

12. The method of claim 1, wherein an insulating layer stack is disposed on said substrate, wherein said ferroelectric layer is one of the layers of said insulating layer stack.

* * * * *